(12) United States Patent
Takaoka et al.

(10) Patent No.: US 12,116,696 B2
(45) Date of Patent: Oct. 15, 2024

(54) SILICON CARBIDE SUBSTRATE

(71) Applicant: SUMITOMO ELECTRIC INDUSTRIES, LTD., Osaka (JP)

(72) Inventors: Hiroki Takaoka, Osaka (JP); Shunsaku Ueta, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 18/291,816

(22) PCT Filed: Jun. 28, 2022

(86) PCT No.: PCT/JP2022/025747
§ 371 (c)(1),
(2) Date: Jan. 24, 2024

(87) PCT Pub. No.: WO2023/008054
PCT Pub. Date: Feb. 2, 2023

(65) Prior Publication Data
US 2024/0254656 A1 Aug. 1, 2024

(30) Foreign Application Priority Data

Jul. 30, 2021 (JP) .................................. 2021-125364

(51) Int. Cl.
*C30B 29/36* (2006.01)
*C01B 32/956* (2017.01)
*C30B 23/06* (2006.01)

(52) U.S. Cl.
CPC ............ *C30B 29/36* (2013.01); *C01B 32/956* (2017.08); *C30B 23/063* (2013.01)

(58) Field of Classification Search
CPC ............................. C30B 29/36; C30B 23/063
See application file for complete search history.

(56) References Cited

U.S. PATENT DOCUMENTS

2023/0392286 A1* 12/2023 Ito .......................... C30B 29/36
2024/0183072 A1* 6/2024 Ito .......................... C30B 29/36

FOREIGN PATENT DOCUMENTS

| CN | 103614779 A | 3/2014 |
| JP | 2015-093810 A | 5/2015 |
| JP | 2017-055086 A | 3/2017 |

(Continued)

*Primary Examiner* — Elizabeth E Mulvaney
(74) *Attorney, Agent, or Firm* — Renner, Otto, Boisselle & Sklar, LLP

(57) ABSTRACT

A silicon carbide substrate includes a dopant. The silicon carbide substrate has, on an off-downstream side with respect to a center of the silicon carbide substrate in plan view, a portion having a resistivity lower than a resistivity at the center of the silicon carbide substrate in plan view. A value obtained by dividing a difference between the resistivity of the silicon carbide substrate at the center of the silicon carbide substrate in plan view and a minimum resistivity of the silicon carbide substrate on the off-downstream side with respect to the center of the silicon carbide substrate in plan view by the resistivity of the silicon carbide substrate at the center of the silicon carbide substrate in plan view is 0.015 or less. The resistivity of the silicon carbide substrate increases from a position at which the silicon carbide substrate has the minimum resistivity toward the off-downstream side.

8 Claims, 12 Drawing Sheets

(56) References Cited

FOREIGN PATENT DOCUMENTS

| | | |
|---|---|---|
| JP | 2017-065955 A | 4/2017 |
| JP | 2017-095319 A | 6/2017 |
| JP | 2019-021694 A | 2/2019 |

\* cited by examiner

SILICON CARBIDE SUBSTRATE

TECHNICAL FIELD

The present disclosure relates to a silicon carbide substrate. The present application claims priority to Japanese Patent Application No. 2021-125364 filed on Jul. 30, 2021, the entire contents of which are incorporated herein by reference.

BACKGROUND ART

For example, Japanese Unexamined Patent Application Publication No. 2015-93810 (PTL 1) describes a SiC single crystal. The SiC single crystal described in PTL 1 is formed from a seed crystal using a sublimation recrystallization method. When the SiC single crystal described in PTL 1 is grown, the temperature is lower at the central portion of the crystal growth surface of the seed crystal and is higher at the peripheral portion of the crystal growth surface of the seed crystal.

Therefore, when the SiC single crystal described in PTL 1 is grown, the crystal growth rate at the central portion of the crystal growth surface of the seed crystal becomes faster, and the crystal growth rate at the peripheral portion of the crystal growth surface of the seed crystal becomes slower, so that the crystal growth surface of the seed crystal has a convex curved surface.

CITATION LIST

Patent Literature

PTL 1: Japanese Unexamined Patent Application Publication No. 2015-93810

SUMMARY OF INVENTION

A silicon carbide substrate according to the present disclosure includes a dopant. The silicon carbide substrate has, on an off-downstream side with respect to a center of the silicon carbide substrate in plan view, a portion having a resistivity lower than a resistivity at the center. A value obtained by dividing a difference between the resistivity of the silicon carbide substrate at the center and a minimum resistivity of the silicon carbide substrate on the off-downstream side with respect to the center by the resistivity of the silicon carbide substrate at the center is 0.015 or less. The resistivity of the silicon carbide substrate increases from a position at which the silicon carbide substrate has the minimum resistivity toward the off-downstream side.

DETAILED DESCRIPTION

Figure 1:
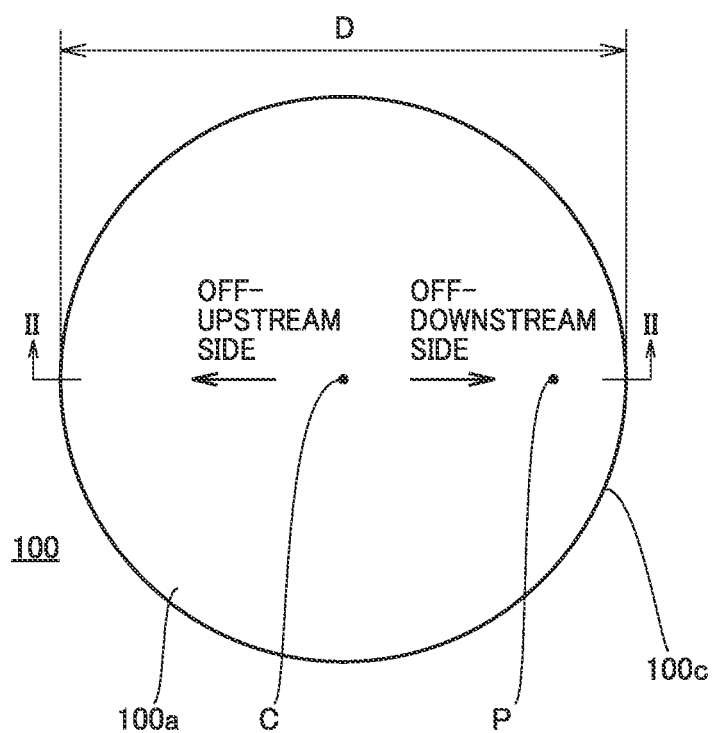
FIG. 1 is a plan view of a silicon carbide substrate 100.

Problem to be Solved by the Present Disclosure

As described above, when the SiC single crystal described in PTL 1 is formed, the temperature is lower at the central portion of the crystal growth surface of the seed crystal, and is higher at the peripheral portion of the crystal growth surface of the seed crystal. Therefore, when the SiC single crystal described in PTL 1 is formed, the dopant is more likely to be incorporated into the central portion of the crystal growth surface of the seed crystal than the peripheral portion of the crystal growth surface of the seed crystal.

As a result, in the SiC single crystal described in PTL 1, a thermal expansion coefficient of the central portion is smaller than that of the peripheral portion, and a tensile stress remains in the peripheral portion due to the difference between the thermal expansion coefficients. In a substrate cut out from the SiC single crystal described in PTL 1, cracks may occur due to the residual tensile stress.

Furthermore, as described above, in the SiC single crystal described in PTL 1, since the crystal growth surface is a protruding curved surface, an inclination angle relative to a (0001) plane is larger than the off-angle in the peripheral portion of the crystal growth surface on the off-downstream side, and stacking faults are likely to occur.

The present disclosure has been made in view of the problems of conventional technology as described above. More specifically, the present disclosure provides a silicon carbide substrate in which the occurrence of cracks, the occurrence of stacking faults, and the occurrence of heterogeneous crystals can be reduced.

Effects of the Present Disclosure

According to the silicon carbide substrate of the present disclosure, the occurrence of cracks, the occurrence of stacking faults and the occurrence of heterogeneous crystals can be reduced.

DESCRIPTION OF EMBODIMENTS OF THE PRESENT DISCLOSURE

First, embodiments of the present disclosure will be listed and described.

(1) A silicon carbide substrate according to an embodiment includes a dopant. The silicon carbide substrate has, on an off-downstream side with respect to a center of the silicon carbide substrate in plan view, a portion having a resistivity lower than a resistivity at the center. A value obtained by dividing a difference between the resistivity of the silicon carbide substrate at the center and a minimum resistivity of the silicon carbide substrate on the off-downstream side with respect to the center by the resistivity of the silicon carbide substrate at the center is 0.015 or less. The resistivity of the silicon carbide substrate increases from a position at which the silicon carbide substrate has the minimum resistivity toward the off-downstream side.

According to the silicon carbide substrate of the above (1), the occurrence of cracks, the occurrence of stacking faults and the occurrence of heterogeneous crystals can be reduced.

(2) A silicon carbide substrate according to another embodiment includes a dopant. The silicon carbide substrate has, at an outer periphery of the silicon carbide substrate on an off-downstream side with respect to the center of the silicon carbide substrate in plan view, a portion having a resistivity lower than a resistivity at the center. The silicon carbide substrate has a minimum resistivity at the outer periphery. A value obtained by dividing a difference between the resistivity of the silicon carbide substrate at the center and the minimum resistivity of the silicon carbide substrate at the outer periphery by the resistivity of the silicon carbide substrate at the center is 0.015 or less.

According to the silicon carbide substrate in the above (2), the occurrence of cracks, the occurrence of stacking faults and the occurrence of heterogeneous crystals can be reduced.

(3) In the silicon carbide substrate according to the above (1) or (2), an outer diameter of the silicon carbide substrate may be 150 mm or more.

According to the silicon carbide substrate in the above (3), even when the silicon carbide substrate has a large outer diameter, the occurrence of cracks and the occurrence of stacking faults can be reduced.

(4) In the silicon carbide substrate according to any one of the above (1) to (3), the dopant may be nitrogen. The difference between the resistivity of the silicon carbide substrate at the center of the silicon carbide substrate and the minimum resistivity of the silicon carbide substrate on the off-downstream side with respect to the center may be 0.22 mΩ·cm or less.

(5) In the silicon carbide substrate according to any one of the above (1) to (4), an area ratio of a stacking fault may be 20 percent or less.

DETAILS OF EMBODIMENT OF THE PRESENT DISCLOSURE

The details of the embodiment of the present disclosure will now be described with reference to the drawings. In the drawings below, the same or corresponding elements are denoted by the same reference numerals, and redundant description thereof will not be repeated. Regarding crystallographic denotation herein, an individual orientation, a group orientation, an individual plane, and a group plane are shown in [ ], < >, ( ) and { }, respectively. A crystallographically negative index is normally expressed by a number with a bar "-" thereabove, however, a negative sign herein precedes a number.

(Configuration of Silicon Carbide Substrate According to Embodiment)

Hereinafter, a configuration of a silicon carbide substrate according to an embodiment will be described. The silicon carbide substrate according to the embodiment is referred to as a silicon carbide substrate 100.

Figure 2:
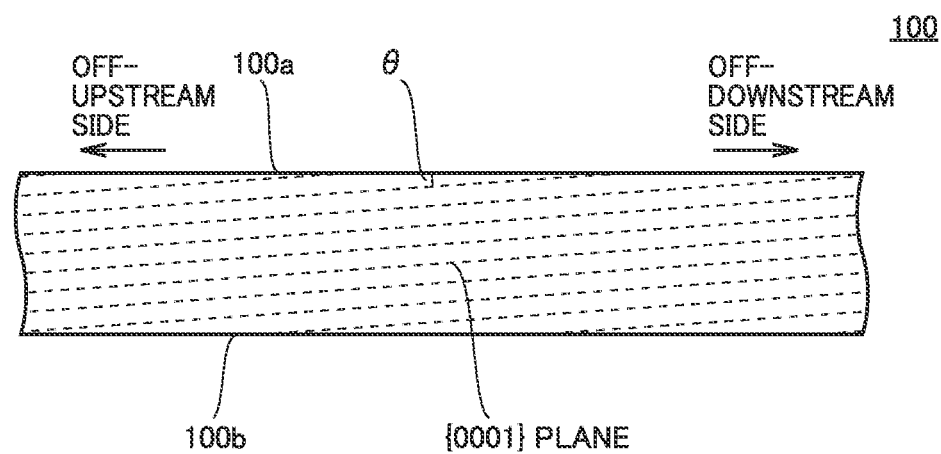
FIG. 2 is a cross-sectional view of silicon carbide substrate 100.

FIG. 1 is a plan view of silicon carbide substrate 100. FIG. 2 is a cross-sectional view of silicon carbide substrate 100. As shown in FIG. 1 and FIG. 2, silicon carbide substrate 100 has a first main surface 100a and a second main surface 100b. First main surface 100a and second main surface 100b are end faces of silicon carbide substrate 100 in a thickness direction. Second main surface 100b is a surface opposite to first main surface 100a. An outer periphery of silicon carbide substrate 100 is referred to as an outer periphery 100c.

Silicon carbide substrate 100 is formed of a silicon carbide single crystal. A polytype of silicon carbide forming silicon carbide substrate 100 is, for example, 4H. However, the polytype of silicon carbide forming silicon carbide substrate 100 is not limited thereto. The polytype of silicon carbide forming silicon carbide substrate 100 may be, for example, 6H.

Silicon carbide substrate 100 includes a dopant. The dopant included in silicon carbide substrate 100 is an n-type dopant or a p-type dopant. Specific examples of the n-type dopant include nitrogen and phosphorus. Specific examples of the p-type dopant include aluminum and boron. The dopant included in silicon carbide substrate 100 is preferably nitrogen.

First main surface 100a is inclined at an off-angle θ in an off-direction relative to a {0001} plane of silicon carbide forming silicon carbide substrate 100. The off-direction is, for example, a <11-20> direction. The off-direction may be a <1-100> direction. In FIG. 2, the {0001} plane of silicon carbide forming silicon carbide substrate 100 is indicated by dotted lines.

Figure 3:
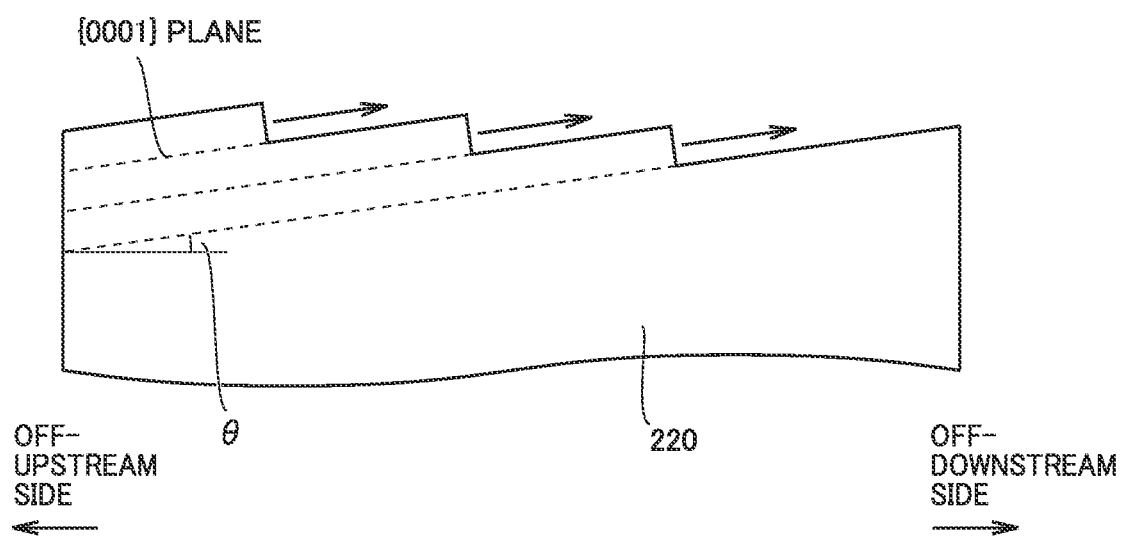
FIG. 3 is a schematic cross-sectional view illustrating a step-flow growth on a seed crystal 220 in which a crystal growth surface is inclined at an off-angle θ.

FIG. 3 is a schematic cross-sectional view illustrating a step-flow growth on seed crystal 220 in which a crystal growth surface is inclined at an off-angle θ. As shown in FIG. 3, a crystal is grown in the direction indicated by the arrows in FIG. 3 on seed crystal 220 by the step-flow growth. The downstream side of the step-flow growth is referred to as an off-downstream side. In the example shown in FIG. 3, the right side is the off-downstream side and the left side is an off-upstream side.

Figure 4:
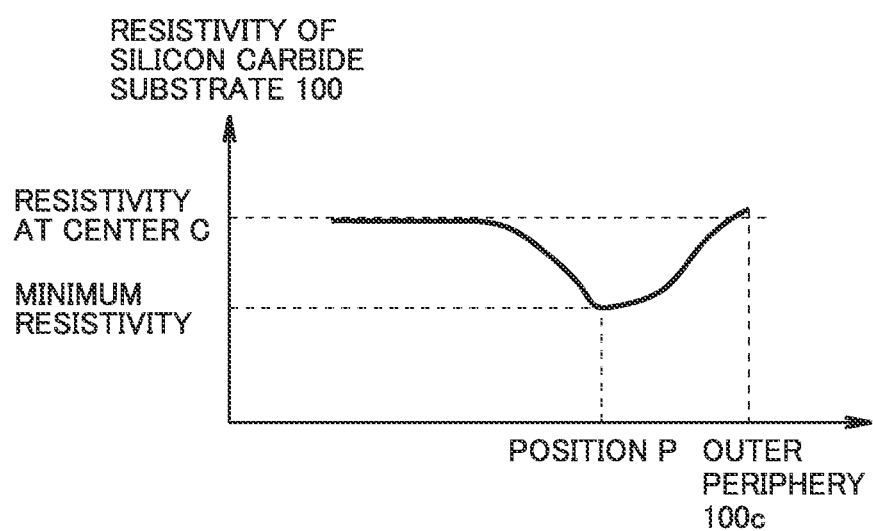
FIG. 4 is a schematic graph illustrating a resistivity of silicon carbide substrate 100 on the off-downstream side with respect to a center C.

As shown in FIG. 1, the center of silicon carbide substrate 100 in plan view is referred to as a center C. FIG. 4 is a schematic graph illustrating a resistivity of silicon carbide substrate 100 on the off-downstream side with respect to center C. As shown in FIG. 4, silicon carbide substrate 100 has, on the off-downstream side with respect to center C, a portion having a resistivity lower than a resistivity at center C. This portion is located radially outward from center C. Silicon carbide substrate 100 has a minimum resistivity at a position P. The resistivity of silicon carbide substrate 100 increases from position P toward the off-downstream side (radially outward).

A value obtained by dividing a difference between the resistivity of silicon carbide substrate 100 at center C and the resistivity of silicon carbide substrate 100 at position P (the minimum resistivity of silicon carbide substrate 100) by the resistivity of silicon carbide substrate 100 at center C is 0.015 or less.

When the dopant included in silicon carbide substrate 100 is nitrogen, the difference between the resistivity of silicon carbide substrate 100 at center C and the resistivity of silicon carbide substrate 100 at position P is 0.22 mΩ·cm or less.

Figure 5:
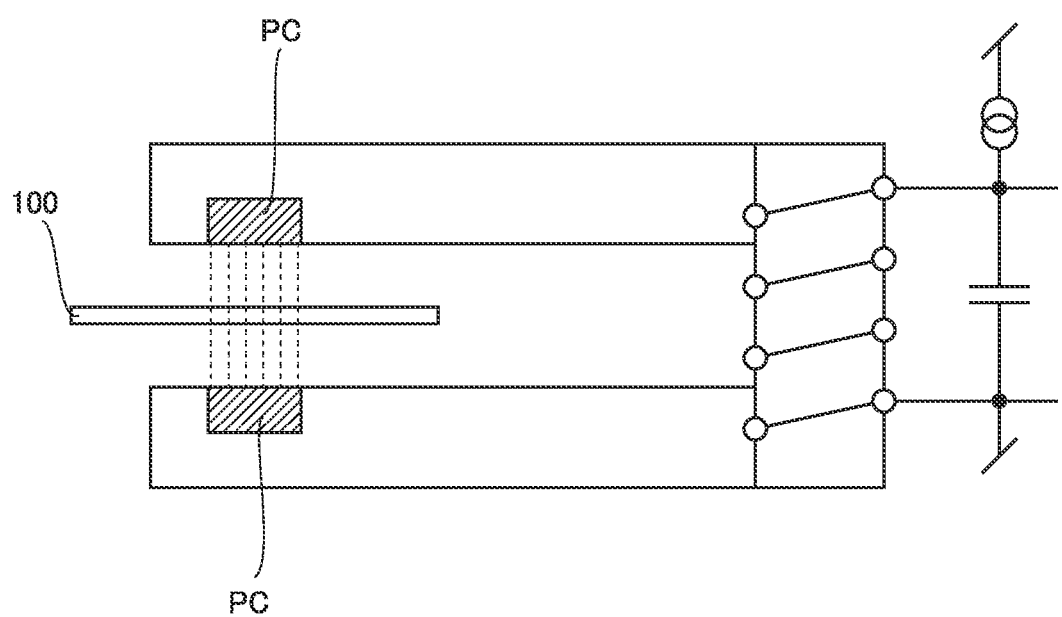
FIG. 5 is a schematic diagram illustrating a method of measuring the resistivity of silicon carbide substrate 100 using a measurement apparatus.

The resistivity of silicon carbide substrate 100 is measured at room temperature using a NC-10 (referred to as a "measurement apparatus") manufactured by NAPSON CORPORATION by an eddy current method. FIG. 5 is a schematic diagram illustrating a method of measuring the resistivity of silicon carbide substrate 100 using the measurement apparatus. As shown in FIG. 5, in the measurement of the resistivity of silicon carbide substrate 100 using the measurement apparatus, first, silicon carbide substrate 100 to be measured is disposed in the measurement apparatus. Silicon carbide substrate 100 is disposed between a pair of probe cores PC. The probe cores PC have a diameter of 25 mm. Second, a high frequency is applied between the probe cores PC. As a result, magnetic fluxes (indicated by dotted lines in FIG. 5) are generated between the probe cores PC. This magnetic fluxes induces an eddy current in silicon carbide substrate 100. When the eddy current is induced in silicon carbide substrate 100, a power loss occurs and a current flowing through a circuit of the measurement apparatus decreases.

A decrease in the current is inversely proportional to a sheet resistance of silicon carbide substrate 100. Therefore, the measurement apparatus enable the measurement of the resistivity of silicon carbide substrate 100 based on a detected decrease in the current, a calibration curve of the sheet resistance (a calculation formula representing a relationship between the decrease in the current and the sheet resistance), and a thickness of silicon carbide substrate 100.

In silicon carbide substrate 100, an area ratio of stacking faults is preferably 20 percent or less. The area ratio of stacking faults is calculated by performing a photoluminescence measurement. More specifically, first, silicon carbide substrate 100 is sectioned into a plurality of measurement areas. Each of measurement areas is 2.7 mm×2.7 mm in size. Second, photoluminescence measurement is performed on silicon carbide substrate 100. Light emission is observed in a measurement area in which a stacking fault exists. Third, a value obtained by dividing the number of measurement areas in which light emission is observed by a total number of measurement areas is multiplied by 100. Through these steps, the area ratio of the stacking faults is obtained.

An outer diameter of silicon carbide substrate 100 is referred to as an outer diameter D. Outer diameter D is, for example, 100 mm (4 inches) or more. Outer diameter D is preferably 150 mm (6 inches) or more. However, outer diameter D may be less than the 100 mm.

(Method for Manufacturing Silicon Carbide Substrate According to Embodiment)

Hereinafter, a method of manufacturing silicon carbide substrate 100 will be described.

Figure 6:
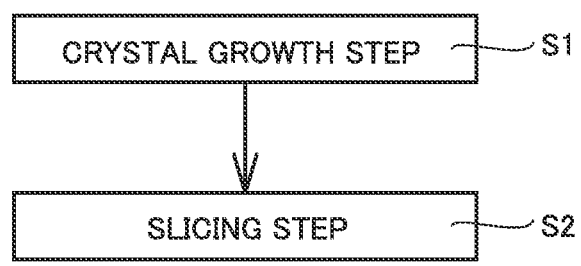
FIG. 6 is a flowchart illustrating a method of manufacturing silicon carbide substrate 100.

FIG. 6 is a flowchart illustrating a method of manufacturing silicon carbide substrate 100. As shown in FIG. 6, the method of manufacturing silicon carbide substrate 100 includes a crystal growth step S1 and a slicing step S2.

Figure 7:
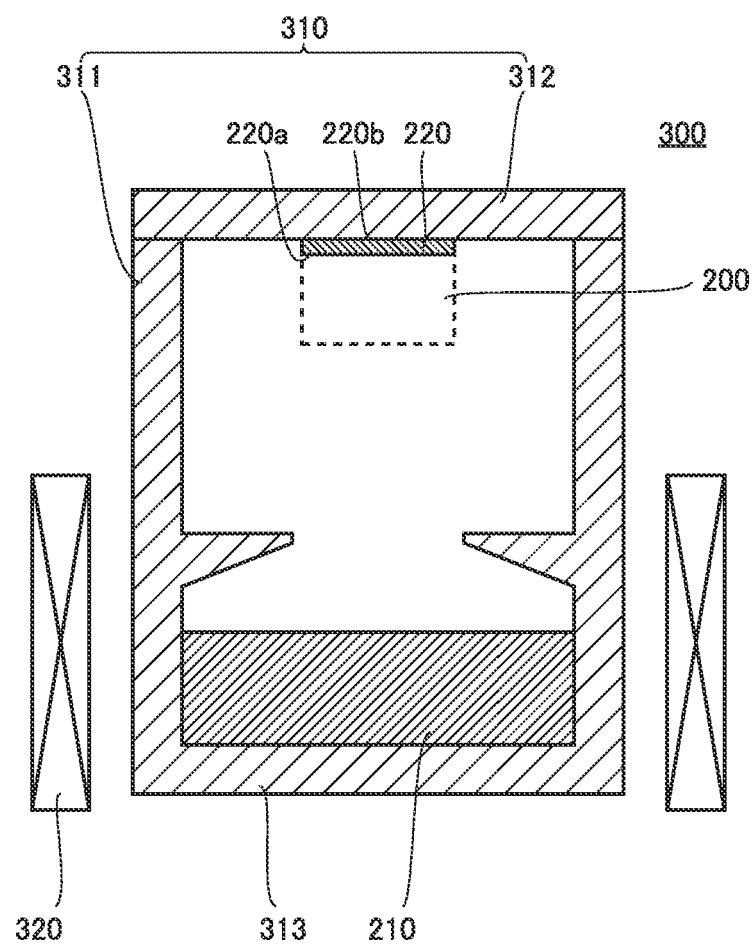
FIG. 7 is a schematic cross-sectional view of a manufacturing apparatus 300.

In crystal growth step S1, an ingot 200 is formed by a sublimation recrystallization method. In crystal growth step S1, a manufacturing apparatus 300 is employed. FIG. 7 is a schematic cross-sectional view of manufacturing apparatus 300. As shown in FIG. 7, manufacturing apparatus 300 includes a crucible 310 and a heater 320.

Crucible 310 is formed of a heat-resistant material. Crucible 310 is made of graphite, for example. Crucible 310 has a cylindrical portion 311 and a lid 312. One end of cylindrical portion 311 is closed by a bottom wall 313. A source material 210 is disposed in cylindrical portion 311. Source material 210 is a silicon carbide powder.

The other end of cylindrical portion 311 is closed by lid 312. Seed crystal 220 is attached to an inner wall surface of lid 312. Thus, seed crystal 220 is disposed inside crucible 310. Seed crystal 220 has a first main surface 220a and a second main surface 220b. First main surface 220a faces source material 210. In other words, first main surface 220a serves as a crystal growth surface of seed crystal 220. Second main surface 220b is opposite to first main surface 220a, and is attached to lid 312.

Seed crystal 220 is formed of a silicon carbide single crystal. First main surface 220a is inclined at off-angle θ in the off-direction relative to the {0001} plane of silicon carbide forming seed crystal 220.

Heater 320 externally heats crucible 310 to sublimate source material 210. Heater 320 is, for example, a resistive heater. Sublimated source material 210 is directed to seed crystal 220 and recrystallized on first main surface 220a. As this process is repeated, a crystal is grown on seed crystal 220 to obtain an ingot 200 (indicated by a dotted line in FIG. 7).

Figure 8:
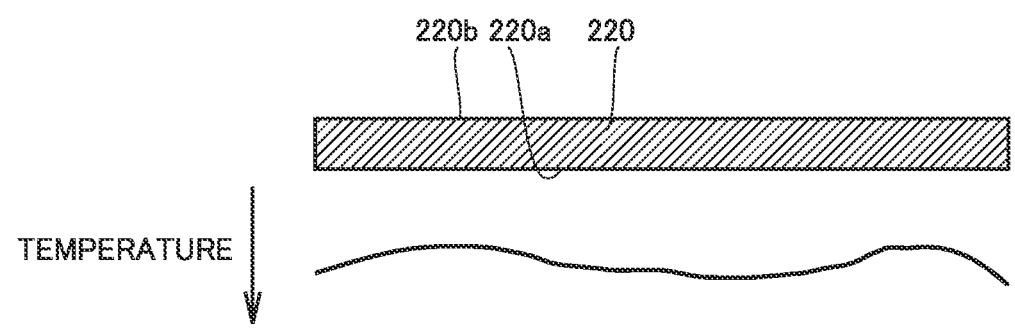
FIG. 8 is a schematic diagram illustrating a temperature distribution in a vicinity of seed crystal 220.

FIG. 8 is a schematic diagram illustrating a temperature distribution in a vicinity of seed crystal 220. The solid line curve in FIG. 8 shows a relationship between a position on seed crystal 220 and a temperature at the position. As shown in FIG. 8, the temperature in the vicinity of seed crystal 220 decreases radially outward from the center of seed crystal 220 and reaches a minimum temperature. The temperature in the vicinity of seed crystal 220 becomes the minimum temperature and then increases radially outward. Such a temperature distribution in the vicinity of seed crystal 220 can be obtained by adjusting, for example, an output of heater 320 and/or an arrangement of a heat insulator disposed around crucible 310. More specifically, for example, the temperature distribution as described above is achieved by reducing a thickness of the heat insulator in a vicinity of a position where the temperature is to be lowered and increasing the thickness of the heat insulator in a vicinity of a position where the temperature is to be raised.

A thickness of ingot 200 at a central portion of a front face of ingot 200 is referred to as a first thickness. A maximum thickness of ingot 200 is referred to as a second thickness. Preferably, the temperature distribution is selected such that a value obtained by subtracting the first thickness from the second thickness is 2 mm or less.

In slicing step S2, silicon carbide substrate 100 is cut out from ingot 200 formed in crystal growth step S1. Silicon carbide substrate 100 is cut out from ingot 200 using, for example, a wire saw.

At a position where a temperature on the crystal growth surface is high, the amount of incorporated dopant is small, so that a thermal expansion coefficient and a resistivity are large. On the other hand, at a position where the temperature of the crystal growth surface is low, the amount of incorporated dopant is large and the thermal expansion coefficient and the resistivity are small.

Figure 9:
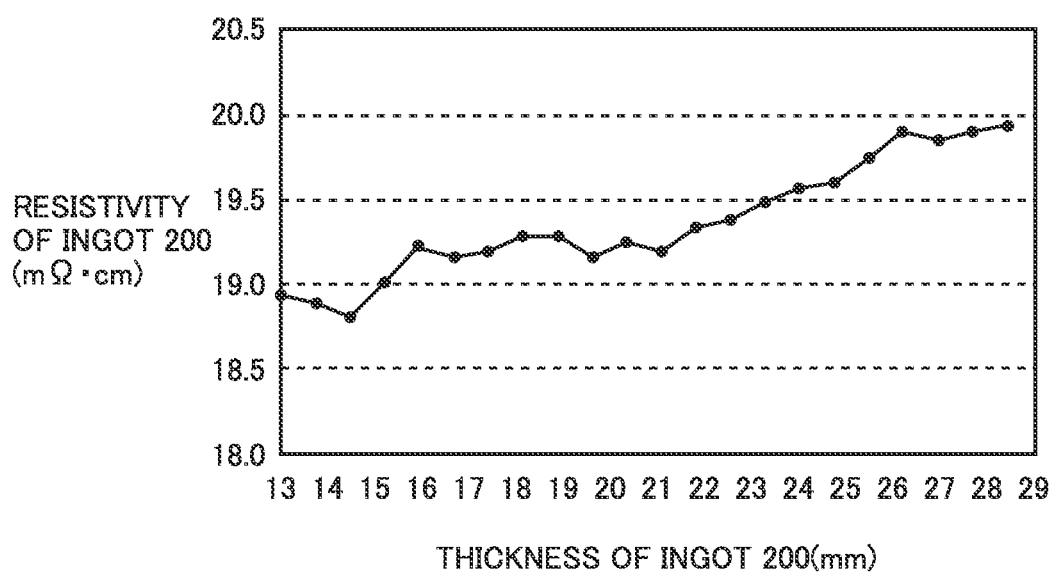
FIG. 9 is a graph illustrating a relationship between a thickness of an ingot 200 and a resistivity of ingot 200.

FIG. 9 is a graph illustrating a relationship between the thickness of ingot 200 and the resistivity of ingot 200. In FIG. 9, a horizontal axis represents the thickness (unit: mm) of ingot 200, and the thickness is calculated as a distance from first main surface 220a of seed crystal 220. In FIG. 9, a vertical axis represents the resistivity (unit: mΩ·cm) of ingot 200. FIG. 9 shows the relationship between the thickness of ingot 200 and the resistivity of ingot 200 when the dopant is nitrogen.

As shown in FIG. 9, as the thickness of ingot 200 increases, the resistivity of the ingot 200 increases. This is because, as the crystal growth progresses, the crystal growth surface of seed crystal 220 is positioned closer to source material 210, and thus the temperature of the crystal growth surface of seed crystal 220 is increased and the resistance thereof tends to be increased.

From FIG. 9, it can be seen that the resistivity of ingot 200 is increased by about 0.11 mΩ·cm when the thickness of ingot 200 is increased by 1 mm. Therefore, since the temperature distribution is selected such that the value obtained by subtracting the first thickness from the second thickness is 2 mm or less, the difference between the resistivity at center C and the resistivity at position P is 0.22 mΩ·cm or less in silicon carbide substrate 100 cut out from ingot 200.

Furthermore, in the above-described temperature distribution, the temperature in the vicinity of seed crystal 220 once reaches the minimum temperature and then increases radially outward. Therefore, the content of the dopant in ingot 200 decreases radially outward from a position at which the thickness of ingot 200 is the second thickness. As a result, the resistivity of silicon carbide substrate 100 cut out from ingot 200 increases from position P further toward the off-downstream side.

(Advantageous Effects of Silicon Carbide Substrate According to Embodiment)

Hereinafter, advantageous effects of silicon carbide substrate 100 will be described.

Silicon carbide substrate 100 has, on the off-downstream side with respect to center C, a portion having a resistivity lower than a resistivity at center C. That is, silicon carbide substrate 100 has a smaller thermal expansion coefficient in a region located radially outward from center C. Therefore, in silicon carbide substrate 100, a tensile residual stress is less likely to be generated in the region located radially outward from center C, and the occurrence of cracks is reduced.

Since the temperature distribution during the crystal growth is controlled such that the value obtained by subtracting the first thickness of ingot 200 from the second thickness of ingot 200 is small (to be specific, 2 mm or less) when ingot 200 is formed, a portion of the crystal growth surface whose inclination angle relative to the {0001} plane is larger than off-angle θ is less likely to occur during the crystal growth process. As a result, in silicon carbide substrate 100 cut out from ingot 200, the occurrence of stacking faults is reduced.

When a dopant content is high (resistivity is low) at the outermost periphery of silicon carbide substrate 100, heterogeneous crystals are likely to occur. However, in silicon carbide substrate 100, since the resistivity increases from position P toward the off-downstream side, the occurrence of the heterogeneous crystals is reduced.

EXAMPLES

In order to confirm the effects of silicon carbide substrate 100, Sample 1 and Sample 2 were prepared as samples of silicon carbide substrate 100. Sample 1 satisfied the following conditions (A) to (C): (A) silicon carbide substrate 100 had, on the off-downstream side with respect to center C, a portion having a resistivity of silicon carbide substrate 100 lower than a resistivity at center C. (B) the resistivity of silicon carbide substrate 100 was the minimum at position P, and (C) the resistivity of silicon carbide substrate 100 increased from position P toward the off-downstream side. Sample 2 did not satisfy any of the above conditions (A) to (C).

Table 1 shows an occurrence ratio of cracks, an area ratio of stacking faults, and an occurrence ratio of heterogeneous crystals for Sample 1 and Sample 2. Five samples were prepared for each of Sample 1 and Sample 2, and the occurrence ratio of cracks was evaluated in accordance with the number of samples in which cracks occurred among the five samples. For the occurrence ratio of heterogeneous crystals, five samples were prepared for each of Sample 1 and Sample 2, and the number of samples in which heterogeneous crystals occurred in the five samples was evaluated. The occurrence of heterogeneous crystals was visually confirmed.

TABLE 1

| Sample | Occurrence Ratio of Cracks | Area Ratio of Stacking Faults (%) | Occurrence Ratio of Heterogeneous Crystals |
|---|---|---|---|
| 1 | 3/5 | 30 to 55 | 3/5 |
| 2 | 0/5 | 0 to 20 | 0/5 |

As shown in Table 1, cracks and heterogeneous crystals occurred in three samples of five samples for Sample 2. The area ratio of stacking faults for Sample 2 was in the range of 30 percent to 55 percent. On the other hand, the occurrence of cracks and heterogeneous crystals was not confirmed in any of the five samples for Sample 1. The area ratio of stacking faults for Sample 1 was in the range of 0 percent to 20 percent. From this comparison, it was experimentally demonstrated that the occurrence of cracks, the occurrence of stacking faults, and the occurrence of heterogeneous crystals are reduced when the conditions (A) to (C) were satisfied.

(Modification)

Hereinafter, silicon carbide substrate 100 according to a modification will be described. Silicon carbide substrate 100 according to the modification is referred to as a silicon carbide substrate 100A. Here, a difference between the modification and silicon carbide substrate 100 will be mainly described, and redundant description will not be repeated.

Figure 10:
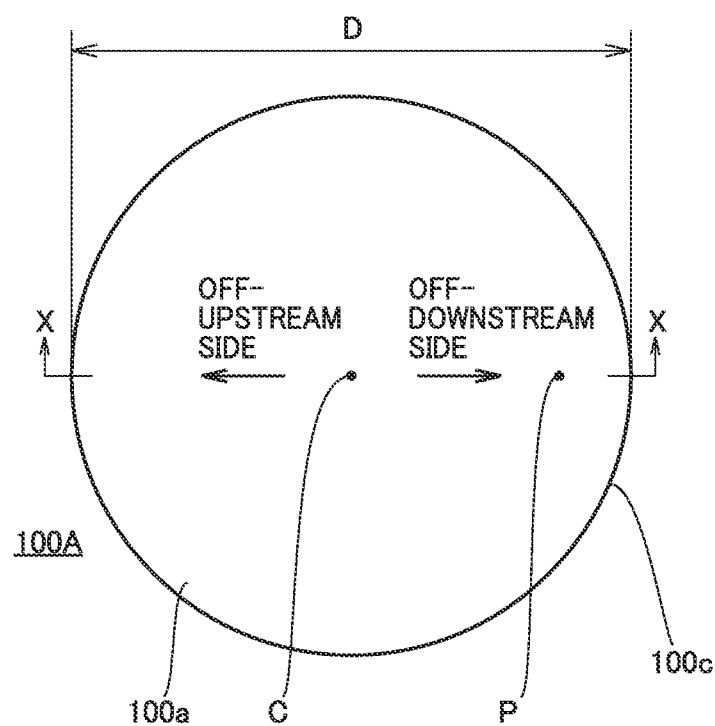
FIG. 10 is a plan view of a silicon carbide substrate 100A.
Figure 11:
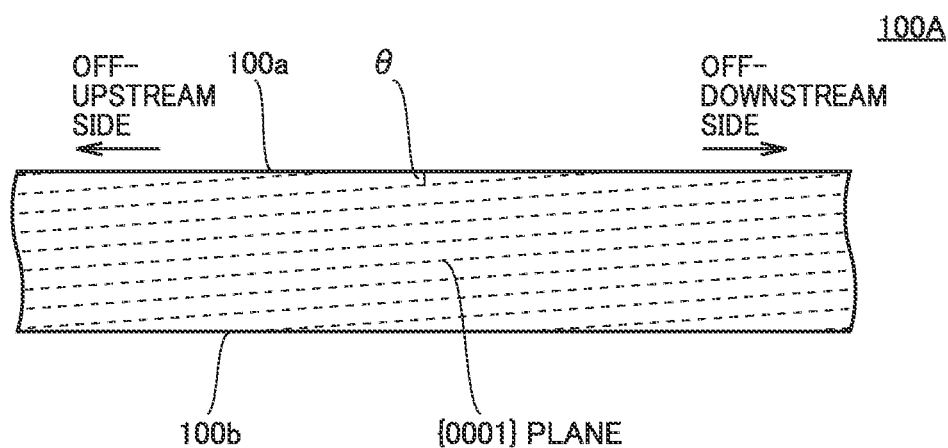
FIG. 11 is a cross-sectional view of silicon carbide substrate 100A.

FIG. 10 is a plan view of silicon carbide substrate 100A. FIG. 11 is a cross-sectional view of silicon carbide substrate 100A. As shown in FIG. 10 and FIG. 11, silicon carbide substrate 100A has first main surface 100a and second main surface 100b. In silicon carbide substrate 100A, an outer diameter is referred to as outer diameter D. In silicon carbide substrate 100A, first main surface 100a is inclined at off-angle θ in the off-direction (for example, <11-20> direction) relative to the {0001} plane of silicon carbide forming silicon carbide substrate 100A. In these respects, the configuration of silicon carbide substrate 100A is common to the configuration of silicon carbide substrate 100.

Figure 12:
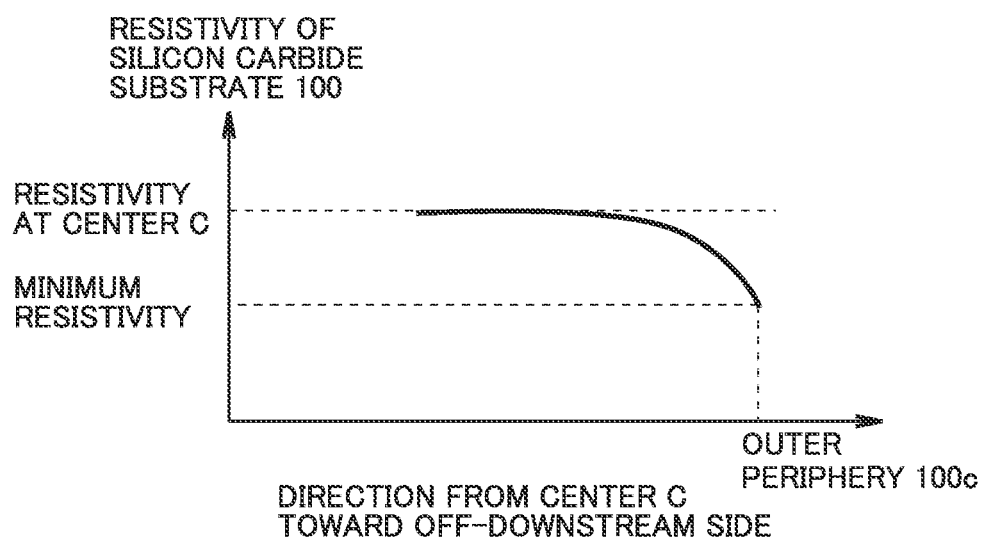
FIG. 12 is a schematic graph illustrating a resistivity of silicon carbide substrate 100A on an off-downstream side with respect to a center C.

Silicon carbide substrate 100A has, at an outer periphery 100c located on the off-downstream side with respect to center C, a portion having a resistivity lower than a resistivity at center C. FIG. 12 is a schematic graph illustrating a resistivity of silicon carbide substrate 100A on the off-downstream side with respect to center C. As shown in FIG. 12, silicon carbide substrate 100A has a minimum resistivity at outer periphery 100c located on a downstream side with respect to center C.

In addition, a value obtained by dividing a difference between the resistivity at center C of silicon carbide substrate 100A and the resistivity at outer periphery 100c of silicon carbide substrate 100A by the resistivity at center C of silicon carbide substrate 100A is 0.015 or less. When the dopant included in silicon carbide substrate 100A is nitrogen, the difference between the resistivity at center C of silicon carbide substrate 100A and the resistivity at outer periphery 100c of silicon carbide substrate 100A is 0.22 mΩ·cm or less. In these respects, the configuration of silicon carbide substrate 100A is different from the configuration of silicon carbide substrate 100.

In a step of manufacturing silicon carbide substrate 100A, ingot 200 is formed such that an outer diameter of ingot 200 is greater than outer diameter D. Then, before slicing step S2 is performed, ingot 200 is ground such that the outer diameter of ingot 200 is equal to outer diameter D. That is, silicon carbide substrate 100 whose outer periphery 100c is removed by processing is silicon carbide substrate 100A. Therefore, in silicon carbide substrate 100A, the occurrence of cracks, the occurrence of stacking faults, and the occurrence of heterogeneous crystals can be reduced as in silicon carbide substrate 100.

It should be understood that the embodiments disclosed herein are illustrative and non-restrictive in every respect. The scope of the present invention is defined by the terms of the claims rather than the embodiments described above, and is intended to include any modifications within the scope and meaning equivalent to the terms of the claims.

REFERENCE SIGNS LIST 100, 100A silicon carbide substrate; 100a first main surface; 100b second main surface; 100c outer periphery; 200 ingot; 210 source material; 220 seed crystal; 220a first main surface; 220b second main surface; 300 manufacturing apparatus; 310 crucible; 311 cylindrical portion; 312 lid; 313 bottom wall; 320 heater; C center; D outer diameter; P position; S1 crystal growth step; S2 slicing step.

The invention claimed is:

1. A silicon carbide substrate comprising a dopant,
wherein the silicon carbide substrate has, on an off-downstream side with respect to a center of the silicon carbide substrate in plan view, a portion having a resistivity lower than a resistivity at the center,
a value obtained by dividing a difference between the resistivity of the silicon carbide substrate at the center and a minimum resistivity of the silicon carbide substrate on the off-downstream side with respect to the center by the resistivity of the silicon carbide substrate at the center is 0.015 or less, and
the resistivity of the silicon carbide substrate increases from a position at which the silicon carbide substrate has the minimum resistivity toward the off-downstream side.

2. A silicon carbide substrate comprising a dopant,
wherein the silicon carbide substrate has, at an outer periphery of the silicon carbide substrate on an off-downstream side with respect to a center of the silicon carbide substrate in plan view, a portion having a resistivity lower than a resistivity at the center,
the silicon carbide substrate has a minimum resistivity at the outer periphery, and
a value obtained by dividing a difference between the resistivity of the silicon carbide substrate at the center and the resistivity of the silicon carbide substrate at the outer periphery by the resistivity of the silicon carbide substrate at the center is 0.015 or less.

3. The silicon carbide substrate according to claim 1, wherein an outer diameter of the silicon carbide substrate is 150 mm or more.

4. The silicon carbide substrate according to claim 1,
wherein the dopant is nitrogen, and
the difference between the resistivity of the silicon carbide substrate at the center and the minimum resistivity of the silicon carbide substrate on the off-downstream side with respect to the center is 0.22 mΩ·cm or less.

5. The silicon carbide substrate according to claim 1, wherein an area ratio of a stacking fault is 20 percent or less.

6. The silicon carbide substrate according to claim 2, wherein an outer diameter of the silicon carbide substrate is 150 mm or more.

7. The silicon carbide substrate according to claim 2,
wherein the dopant is nitrogen, and
the difference between the resistivity of the silicon carbide substrate at the center and the minimum resistivity of the silicon carbide substrate on the off-downstream side with respect to the center is 0.22 mΩ·cm or less.

8. The silicon carbide substrate according to claim 2, wherein an area ratio of a stacking fault is 20 percent or less.

* * * * *